United States Patent
Lin

(10) Patent No.: US 6,788,477 B2
(45) Date of Patent: Sep. 7, 2004

(54) APPARATUS FOR METHOD FOR IMMERSION LITHOGRAPHY

(75) Inventor: Burn Jeng Lin, Hsin chu (TW)

(73) Assignee: Taiwan SEmiconductor Manufacturing Co., Ltd., Hsin Chu (TW)

(*) Notice: Subject to any disclaimer, the term of this patent is extended or adjusted under 35 U.S.C. 154(b) by 11 days.

(21) Appl. No.: 10/278,962

(22) Filed: Oct. 22, 2002

(65) Prior Publication Data

US 2004/0075895 A1 Apr. 22, 2004

(51) Int. Cl.⁷ .................................................. G02B 7/02
(52) U.S. Cl. ..................................... 359/820; 359/819
(58) Field of Search ............................. 359/819, 820, 359/822, 813, 814, 823, 824, 694, 821

(56) References Cited

U.S. PATENT DOCUMENTS

| | | | | |
|---|---|---|---|---|
| 3,648,587 A | * | 3/1972 | Stevens ........................ 355/44 |
| 4,057,347 A | * | 11/1977 | Moriyama et al. ............. 355/67 |
| 4,480,910 A | * | 11/1984 | Takanashi et al. ............. 355/30 |
| 5,121,256 A | * | 6/1992 | Corle et al. .................. 359/664 |
| 5,139,661 A | * | 8/1992 | Kolbert ..................... 210/198.2 |
| 2001/0002315 A1 | * | 5/2001 | Schultz et al. ............... 436/172 |

* cited by examiner

Primary Examiner—Ricky Mack
(74) Attorney, Agent, or Firm—Tung & Associates

(57) ABSTRACT

An apparatus for immersion lithography that includes an imaging lens which has a front surface, a wafer that has a top surface to be exposed positioned spaced-apart and juxtaposed to the front surface of the imaging lens, and a fluid that has a refractive index between about 1.0 and about 2.0 filling a gap formed in-between the front surface of the imaging lens and the top surface of the wafer. A method for immersion lithography can be carried out by flowing a fluid through a gap formed in-between the front surface of an imaging lens and a top surface of a wafer. The flow rate and temperature of the fluid can be controlled while particulate contaminants are filtered out by a filtering device.

19 Claims, 2 Drawing Sheets

APPARATUS FOR METHOD FOR IMMERSION LITHOGRAPHY

FIELD OF THE INVENTION

The present invention generally relates to apparatus and method for photolithography and more particularly, relates to apparatus and method for immersion lithography wherein a fluid fills a gap formed between an imaging lens and a wafer surface.

BACKGROUND OF THE INVENTION

The resolution of optical projections imaging is proportional to the imaging wavelength λ and inversely proportional to the numerical aperture (NA) of the imaging lens. The numerical aperture is the product of the refractive index n of the light propagation medium between the imaging lens and the image and sine of the half aperture angle of the imaging lens sinθ. Presently, λ is reduced to 193 nm and development work is ongoing for 153 nm while sinθ is approaching 0.9 in many roadmaps. To further reduce λ calls for vacuum and reflective optical systems such as in the case of 13.4 nm EUV imaging. Immersion lithography, which employs a high refractive index fluid between the last surface of the imaging device and the first surface on a wafer or substrate, offers a means to increase the numerical aperture and to reduce the wavelength without concern of the physical limitations.

Immersion microlithography is a known technique for improving the resolution in optical microscope. A drop of high index fluid is placed between the front surface of the microscopic objective lens and the observed sample. Immersion lithography also uses a high index fluid between the front surface (or the last surface) of the imaging lens and the first surface on a wafer or substrate. However, simply putting a drop of fluid between these two surfaces is not sufficient for modern projection mask aligner. Many manufacturing problems have to be overcome.

It is therefore an object of the present invention to provide an apparatus for immersion lithography that does not have the drawbacks or shortcomings of the conventional photolithography apparatus.

It is another object of the present invention to provide an apparatus for immersion lithography that does not have the photoresist outgassing problem.

It is a further object of the present invention to provide an apparatus for immersion lithography that does not have the wafer overheating problem.

It is another further object of the present invention to provide an apparatus for immersion lithography that does not have the particle contamination problem.

It is still another object of the present invention to provide an apparatus for immersion lithography that includes an imaging lens, a wafer and a fluid filling a gap formed between the imaging lens and the wafer.

It is yet another object of the present invention to provide an apparatus for immersion lithography wherein a fluid having a refractive index between about 1.0 and about 2.0 is used to fill a gap formed in-between an imaging lens and a wafer.

It is still another further object of the present invention to provide a method for conducting immersion lithography by flowing a fluid through a gap formed in-between an imaging lens and a wafer.

SUMMARY OF THE INVENTION

In accordance with the present invention, an apparatus and a method for immersion lithography are provided.

In a preferred embodiment, an apparatus for immersion lithography is provided which includes an imaging lens that has a first surface; a wafer that has a top surface to be exposed positioned spaced-apart and juxtaposed to the front surface of the imaging lens; and a fluid that has a refractive index between about 1.0 and about 2.0 fill a gap formed between the front surface of the imaging lens and the top surface of the wafer.

The apparatus for immersion lithography further includes a wafer holding device for holding the wafer in place, and a fluid-retaining means for maintaining the fluid in the gap formed in-between the front surface of the imaging lens and the top surface of the wafer. The apparatus further includes cover means for sealing the fluid around the imaging lens. The fluid-retaining means may further include fluid circulating means for circulating the fluid through the gas formed in-between the front surface of imaging lens and the top surface of the wafer; a temperature controlling means for controlling a temperature of the fluid; and a fluid-filter means for substantially maintaining said fluid particle-free.

In the apparatus for immersion lithography, the fluid circulating means may be a pump device. The fluid-retaining means may further include a fluid inlet for replenishing fluid in the fluid-retaining means; and a fluid outlet for discharging fluid from the fluid-retaining means. The wafer holding means may be a vacuum means or a mechanical means. The wafer holding means may further include wafer-tilting means. The apparatus may further include mirror means for monitoring a position of the imaging lens and the wafer.

The apparatus for immersion lithography may be a scan-and-repeat mask aligner, a step-and-repeat mask aligner or a proximity mask aligner.

The present invention is further directed to a method for conducting immersion lithography which can be carried out by the operating steps of first providing an imaging lens that has a front surface; then positioning a wafer that has a top surface to be exposed spaced-apart and juxtaposed to the front surface of the imaging lens; and maintaining a fluid that has a refractive index between about 1.0 and about 2.0 in-between the front surface of imaging lens and the top surface of the wafer.

The method for conducting immersion lithography may further include the step of moving the wafer in a lateral direction for repeated exposures, or the step of moving the imaging lens in a longitudinal directions for focusing. The method may further include the step of submerging the wafer in the fluid, or the step of controlling a flow of the fluid between the front surface of the imaging lens and the top surface of the wafer, or the step of filtering the fluid to substantially remove all particles. The method may further include the step of controlling a temperature of the fluid.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses an apparatus for immersion lithography which is constructed by three major components of an imaging lens that has a front surface, a wafer that has a top surface to be exposed positioned spaced-apart and juxtaposed to the front surface of the imaging lens, and a fluid that has a refractive index between about 1.0 and about 2.0 filling a gap formed in-between the front surface of the imaging lens and the top surface of the wafer.

The present invention further discloses a method for conducting immersion lithography by the operating steps of first providing an imaging lens that has a front surface, then positioning a wafer that has a top surface to be exposed spaced-apart and juxtaposed to the front surface of the imaging lens, and then flowing a fluid that has a refractive index between about 1.0 and about 2.0 through a gap formed in-between the front surface of the imaging lens and the top surface of the wafer.

The present invention uses a wafer stage that comprises fluid circulating and cleaning (or filtering) means to overcome the aforementioned problems. The fluid contacts the front surface (or last surface) of the imaging lens which is the imaging device in a projection mask aligner. It also contacts the top surface of the wafer which is usually coated with a layer of a photosensitive material. Optimally, an index matching layer may be coated over the photosensitive material layer providing the front surface. A protective layer coated over the photosensitive material layer may also provide the front surface.

The resolution and depth of focus (DOF) with immersion fluid as a function of $\lambda$ and $\theta$ are governed by the following equations.

$$W = k_1 \cdot \lambda / \sin\theta \qquad \text{Equation 1}$$

$$DOF = k_3 \cdot \lambda / \sin^2(\theta/2), \; \lambda = \lambda_0/n \qquad \text{Equation 2}$$

Where $\lambda$ is the wavelength in the immersion fluid. It is a product of the refractive index of the fluid and $\lambda_0$ is the corresponding wavelength in vacuum. By manipulating $\lambda$ and $\theta$, the improvement in resolution and DOF can be adjusted against each other. The following table shows three situations. The first situation uses the same lens aperture angle, improving resolution by the inverse of the refractive index 1.5, while DOF is also reduced by the same factor. The second situation maintains resolution while stretching DOF to the maximum. The third situation improves resolution and DOF together but neither is pushed to their full individual potential.

| N | $\sin\theta_0$ | $\sin\theta$ | W(immer)/W(air) | DOF(immer)/DOF(air) |
|---|---|---|---|---|
| 1.5 | 0.9 | 0.9 | 0.67 | 0.67 |
| 1.5 | 0.9 | 0.6 | 1 | 1.88 |
| 1.5 | 0.9 | 0.7 | 0.857 | 1.316 |

Figure 3:
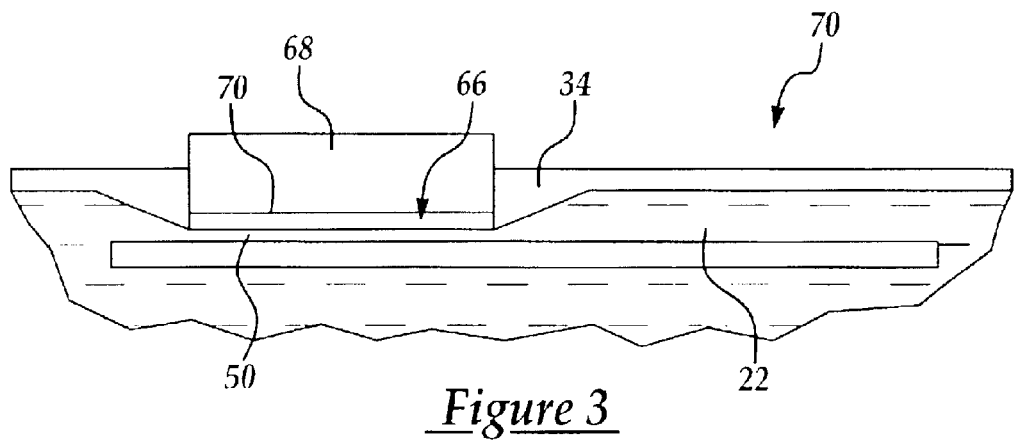
FIG. 3 is a cross-sectional view of an imaging lens for a third embodiment of the present invention apparatus.

Immersion can also be applied to proximity printing as shown in FIG. 3. In this case, there is no imaging lens. The mask serves its normal function and also as the imaging device. The immersion fluid has to contact the mutual facing surfaces of the mask and the wafer. In this case, the resolution and DOF relationship are related by Equation 3.

$$W^2/\lambda \cdot DOF \geq \text{Printable Threshold} \qquad \text{Equation 3}$$

where printable threshold is generally taken as unity.

Figure 1A:
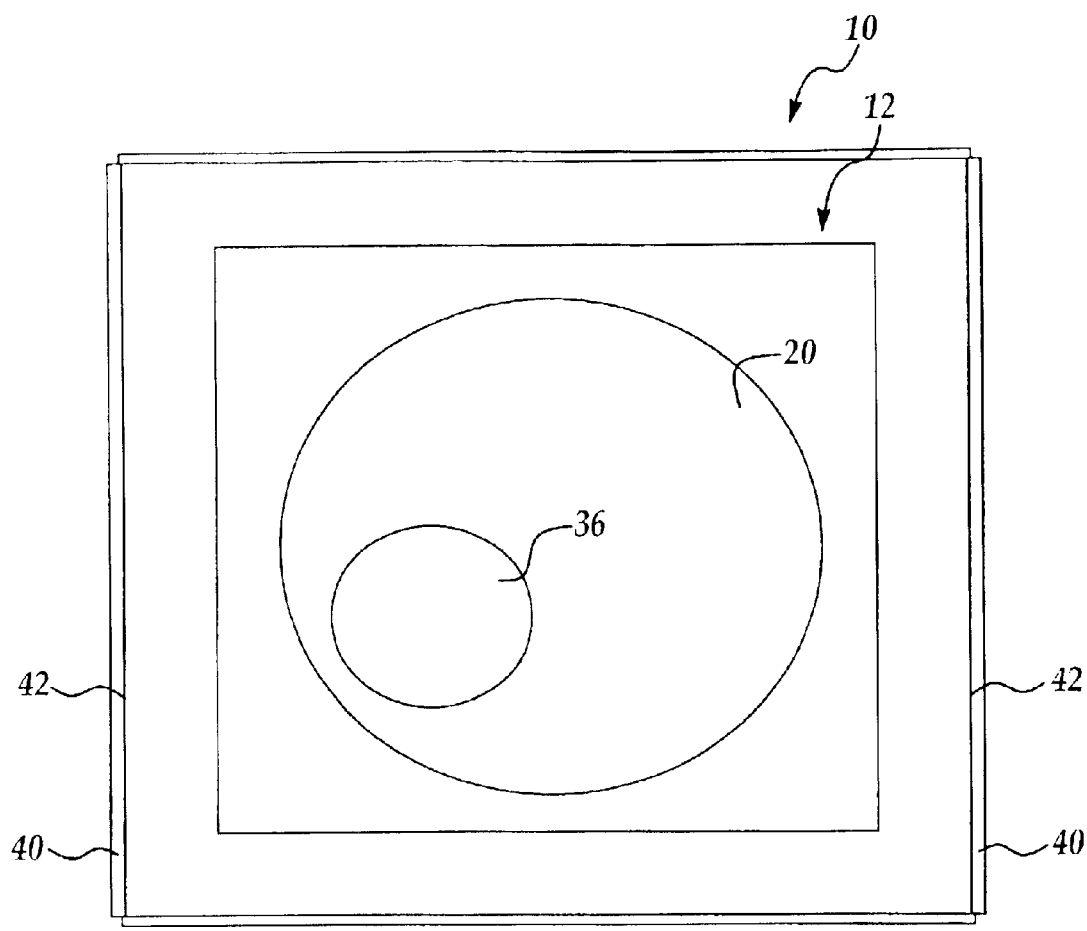
FIG. 1A is a top view of a preferred embodiment of the present invention apparatus for immersion lithography.
Figure 1B:
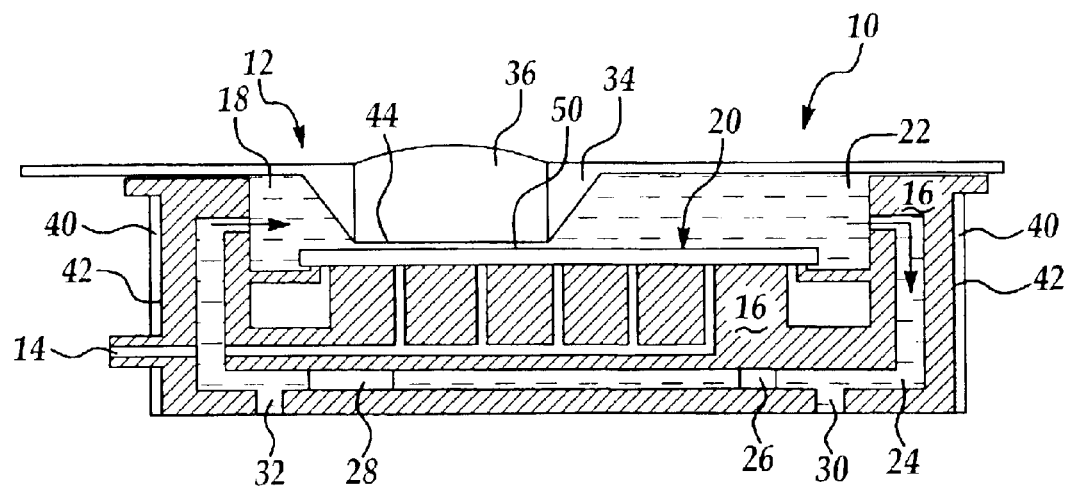
FIG. 1B is a cross-sectional view of the preferred embodiment of the present invention apparatus for immersion lithography shown in FIG. 1A.

Referring now to FIGS. 1A and 1B, wherein a top view and a cross-sectional view of a preferred embodiment of a present invention apparatus 10 are shown, respectively. The apparatus 10 consists mainly of a fluid-containing wafer stage 12 which includes vacuum means 14 for clamping wafer 20 to a wafer chuck 16. The fluid-containing wafer stage 12 further includes an internal cavity 18 for holding a predetermined quantity of fluid 22. A fluid passageway 24 is provided to allow fluid 22 to be delivered to and removed from the internal cavity 18. The passageway 24 further includes a filter means 26 and a pump means 28. The filter means 26 removes substantially particulates generated or introduced into the fluid 22 during operation of the exposure tool. The word "substantially" used in this writing indicates a percentage of at least 80%.

The internal cavity 18 is further equipped with an inlet 30 and an outlet 32 to facilitate the replenishment of new fluid and the discharging of used fluid, respectively. The fluid-containing wafer stage 12 further includes a cover means 34 and a flat lens element 36 having a flat front surface 44 to seal fluid 22 from the atmospheric environment. A mirror means 40 is attached on the sides 42 of the wafer stage 12 for the interferometric monitoring of the stage position. A wafer tilting means (not shown) may further be included in the fluid-containing wafer stage 12 to level the wafer. While structural details are not shown in the simplified drawings of FIGS. 1A and 1B, the wafer stage can be moved in the longitudinal direction for focusing, and in the lateral direction for repeated exposures and/or alignment to the mask.

In the present invention apparatus 10 shown in FIGS. 1A and 1B, the fluid 22 is circulated at a sufficient speed through the gap 50 formed in-between the imaging lens 36 and the wafer 20 in order to carry away gas bubbles, to keep the fluid 22 homogeneous, and to maintain the temperature of the immersing fluid 22. A temperature controlling means (not shown) is further provided for such purpose. Particulate contaminants are filtered out by the filter means 26 and are prevented from getting into the fluid 22 within the internal cavity 18. Any particulate contaminants generated from within or accidentally induced from outside are removed by the filter means 26. A pump means 28 is used to supply the pressure to circulate the fluid 22.

As the immersion fluid 22 inevitably absorbs light, it is desirable to keep the gap 50 between the front surface 44 of the lens 36 and the wafer 20 as small as possible in order to reduce unnecessary light absorption. For instance, it is desirable that gap 50 be kept at less than 5 mm, and preferably between 0.1 and 1 mm.

Figure 2:
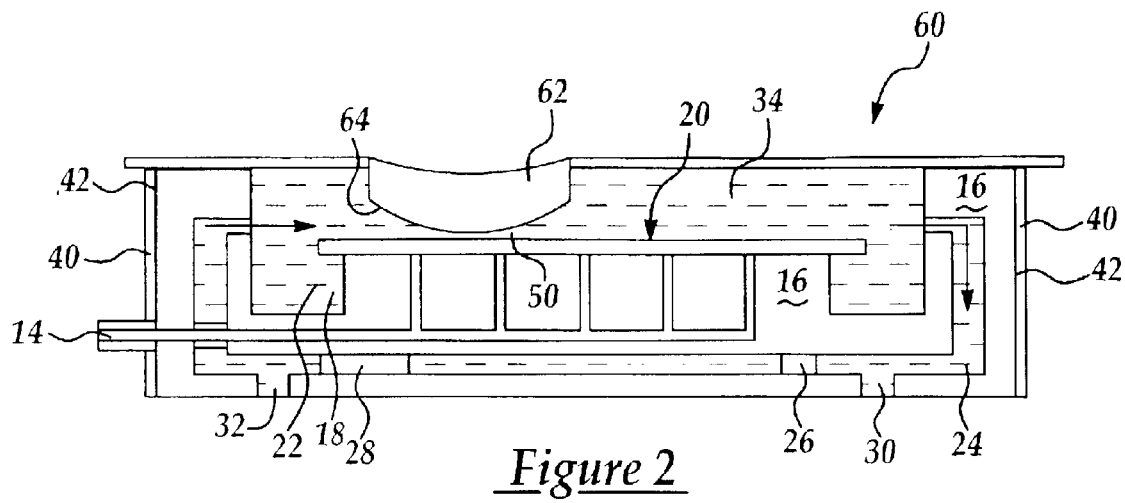
FIG. 2 is a cross-sectional view of a second embodiment of the present invention apparatus for immersion lithography.

A second embodiment 60 of the present invention apparatus for immersion lithography is shown in FIG. 2 in a cross-sectional view. In this second embodiment, a front lens element 62 having a front surface 64 is utilized for achieving a very thin gap 50 maintained between the lens 62 and the wafer 20. The other components in this second embodiment are substantially similar to that shown in the preferred embodiment of FIG. 1B.

A third embodiment 70 of the present invention apparatus for immersion lithography is shown in a simplified form in FIG. 3 in a cross-sectional view. The cover means 34 allows an increase of the thickness of the fluid 22 away from the lens surface in order to facilitate an improved fluid flow through gap 50. It should be noted that the configuration shown in FIG. 3 is that for a proximity printing apparatus wherein a photomask 66 is installed on the front surface 70 of mask holder 68.

Figure 4:
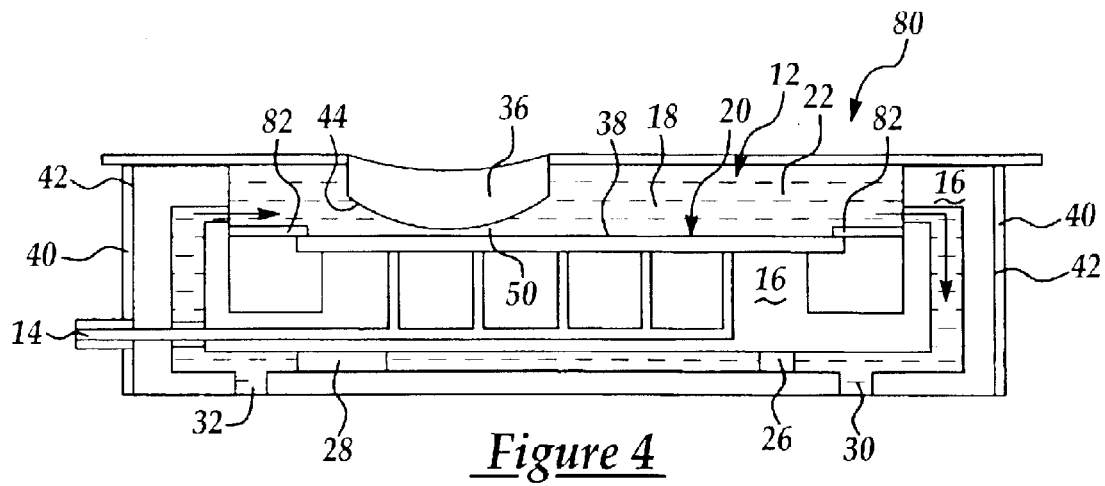
FIG. 4 is a cross-sectional view of the fourth embodiment of the present invention apparatus for immersion lithography.

In a fourth embodiment 80 of the present invention apparatus for immersion lithography, shown in FIG. 4 in a cross-sectional view, the wafer 20 is not completely submerged in the fluid 22. A fluid retaining means 82 is utilized to keep the fluid 22 between the front surface 44 of the imaging lens 36 and the top surface 38 of the wafer 20.

The present invention novel apparatus and method for immersion lithography have therefore been amply described in the above description and in the appended drawings of FIGS. 1A–4.

While the present invention has been described in an illustrative manner, it should be understood that the terminology used is intended to be in a nature of words of description rather than of limitation.

Furthermore, while the present invention has been described in terms of one preferred and three alternate embodiments, it is to be appreciated that those skilled in the art will readily apply these teachings to other possible variations of the inventions.

The embodiment of the invention in which an exclusive property or privilege is claimed are defined as follows.

What is claimed is:

1. An apparatus for immersion lithography comprising:
   an imaging lens having a front surface;
   a wafer having a top surface to be exposed positioned spaced-apart and juxtaposed to said front surface of the imaging lens;
   fluid retaining means for holding a fluid, said fluid having a refractive index between about 1.0 and about 2.0 filling a gap formed in-between said front surface of the imaging lens and said top surface of the wafer; and
   cover means for said fluid-retaining means to protect said fluid around said imaging lens from particulates.

2. An apparatus for immersion lithography according to claim 1 further comprising a wafer holding means for holding said wafer in place.

3. An apparatus for immersion lithography according to claim 1 further comprising a fluid-retaining means for maintaining said fluid in said gap formed in-between said front surface of the imaging lens and said top surface of the wafer.

4. An apparatus for immersion lithography according to claim 1 further comprising
   a wafer holding means for holding said wafer in place.

5. An apparatus for immersion lithography according to claim 1, wherein said apparatus is a device selected from the group consisting of a scan-and-repeat mask aligner, a step-and-repeat mask aligner and a proximity mask aligner.

6. An apparatus for immersion lithography according to claim 3, wherein said fluid-retaining means further comprises fluid circulating means for circulating said fluid through the gap formed in-between said front surface of the imaging lens and said top surface of the wafer.

7. An apparatus for immersion lithography according to claim 3, wherein said fluid-retaining means further comprises a temperature controlling means for controlling a temperature of said fluid.

8. An apparatus for immersion lithography according to claim 3, wherein said fluid-retaining means further comprises a fluid-filter means for substantially maintaining said fluid particle-free.

9. An apparatus for immersion lithography according to claim 6, wherein said fluid circulating means being a pump device.

10. An apparatus for immersion lithography according to claim 1, wherein said fluid-retaining means further comprises:
    a fluid inlet for replenish fluid in said fluid-retaining means; and
    a fluid outlet for discharging fluid from said fluid-retaining means.

11. An apparatus for immersion lithography according to claim 2, wherein said wafer holding means being a vacuum means or a mechanical means.

12. An apparatus for immersion lithography according to claim 2, wherein said wafer holding means further comprises wafer-tilting means.

13. An apparatus for immersion lithography according to claim 1 further comprising mirror means for monitoring a position of said imaging lens and said wafer.

14. A method for conducting immersion lithography comprising the steps of:
    providing an imaging lens having a front surface;
    positioning a wafer having a top surface to be exposed spaced-apart and juxtaposed to said front surface of the imaging lens;
    maintaining a fluid having a refractive index between about 1.0 and about 2.0 in a gap formed in-between said front surface of the imaging lens and said top surface of the wafer; and
    moving said imaging lens in a longitudinal direction for focusing.

15. A method for conducting immersion lithography according to claim 14 further comprising the step of moving said wafer in a lateral direction for repeated exposures.

16. A method for conducting immersion lithography according to claim 14 further comprising the step of controlling a temperature of said fluid.

17. A method for conducting immersion lithography according to claim 14 further comprising the step of submerging said wafer in the fluid.

18. A method for conducting immersion lithography according to claim 14 further comprising the step of controlling a flow of said fluid between said front surface of the imaging lens and said top surface of the wafer.

19. A method for conducting immersion lithography according to claim 14 further comprising the step of filtering said fluid to substantially remove all particles.

* * * * *